US005790832A

United States Patent [19]

Barbier et al.

[11] Patent Number: 5,790,832
[45] Date of Patent: Aug. 4, 1998

[54] METHOD AND APPARATUS FOR TRACING ANY NODE OF AN EMULATION

[75] Inventors: Jean Barbier, Chatillon; Olivier Lepape, Paris; Frederic Reblewski, Les Molieres, all of France

[73] Assignee: Mentor Graphics Corporation, Wilsonville, Oreg.

[21] Appl. No.: 639,248

[22] Filed: Apr. 23, 1996

[51] Int. Cl.[6] ........................................ G06F 9/455
[52] U.S. Cl. ............... 395/500; 364/491; 364/490; 364/489; 364/578; 395/51; 395/23; 395/141
[58] Field of Search .................... 364/578, 491, 364/490, 489; 395/51, 23, 141

[56] References Cited

U.S. PATENT DOCUMENTS

| | | | |
|---|---|---|---|
| 5,084,824 | 1/1992 | Lam et al. | 364/490 |
| 5,416,719 | 5/1995 | Pribetich | 364/489 |
| 5,448,496 | 9/1995 | Butts et al. | 364/489 |
| 5,586,046 | 12/1996 | Feldbaumer et al. | 364/490 |
| 5,598,510 | 1/1997 | Castelaz | 395/23 |
| 5,638,493 | 6/1997 | Ballard | 395/51 |
| 5,659,484 | 8/1997 | Bennett et al. | 364/491 |

OTHER PUBLICATIONS

Designing With FPGAs And CPLDs, By Jesse H. Jenkins (Textbook), 1994.
Neural Networks For Control, Edited By Miller, Sutton and Werbos, Second Edition (Textbook), 1991.

Primary Examiner—Kevin J. Teska
Assistant Examiner—M. Irshadullah
Attorney, Agent, or Firm—Blakely, Sokoloff, Taylor & Zafman, LLP

[57] ABSTRACT

A method and apparatus for tracing any node in an emulator, including hidden nodes of a circuit design, includes maintaining a correspondence between physically observable nodes and hidden nodes of the circuit design being emulated. The correspondence identifies how values of the hidden nodes are to be determined based on corresponding ones of the physically observable nodes. The value of a hidden node is determined by obtaining the values of the corresponding physically observable nodes and identifying the value of the hidden node based on the correspondence between the corresponding physically observable nodes and the hidden node.

20 Claims, 11 Drawing Sheets

METHOD AND APPARATUS FOR TRACING ANY NODE OF AN EMULATION

BACKGROUND OF THE INVENTION

1. Field of the Invention

The present invention relates to the field of emulation systems. More specifically, the present invention relates to methods and apparatus for tracing any node in an emulator.

2. Background Information

Emulation systems for emulating circuit designs are known in the art. Typically, prior art emulation systems are formed using conventional general purpose field programmable gate arrays (FPGAs). A circuit design to be emulated is "realized" on the emulation system by compiling a "formal" description of the circuit design, and mapping the circuit design onto the logic elements (LEs) of the FPGAs.

Emulation systems for emulating circuit designs are particularly valuable because they allow complex circuits to be emulated in both a cost-effective and time-effective manner. Such emulation systems are also valuable because they allow signals to be output from the FPGAs for testing and debugging the circuit designs, thereby providing for "tracing" of signals.

However, these conventional emulation systems have several disadvantages. These disadvantages include the limitation that the states of signals at nodes within the LEs are not observable. For example, combinatorial logic mapped onto an LE may include several nodes which do not have signals that are output by the LE and thus are not observable. These nodes are referred to as "hidden" nodes. These hidden nodes can be made unhidden by mapping one circuit element to each LE, however, such inefficient mapping would be extremely wasteful of the precious LE resources.

Thus, it is desirable to have an emulation system and methodology for operating therein for tracing any node in an emulation, including hidden nodes. As will be described in more detail below, the present invention provides for such an emulation system that achieves these and other desired results, which will be apparent to those skilled in the art from the description to follow.

SUMMARY OF THE INVENTION

A method and apparatus for tracing any node in an emulator, including hidden nodes of a circuit design, is described herein. The method maintains a correspondence between physically observable nodes and hidden nodes of the circuit design being emulated. This correspondence identifies how values of the hidden nodes are to be determined based on the physically observable nodes. The value of a hidden node is determined by obtaining the values of the physically observable nodes and identifying the value of the hidden node based on this correspondence between the physically observable nodes and the hidden node.

In one embodiment, the method and apparatus of the present invention maintain a physically observable net list and a hidden net list. The physically observable net list identifies the locations in the emulator where the physically observable signals can be accessed. The hidden net list identifies nodes of the circuit design which are hidden within logic elements of the emulator. The hidden net list also identifies a set of the physically observable nodes which can be used as an index into a truth table vector, the truth table vector being stored in an encoded format in the hidden net list. The method and apparatus of this embodiment determines the value of the hidden node by indexing into the truth table vector using the identified set of physically observable nodes.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, for purposes of explanation, specific numbers, materials and configurations are set forth in order to provide a thorough understanding of the present invention. However, it will be apparent to one skilled in the art that the present invention may be practiced without the specific details. In other instances, well known features are omitted or simplified in order not to obscure the present invention.

Figure 1:
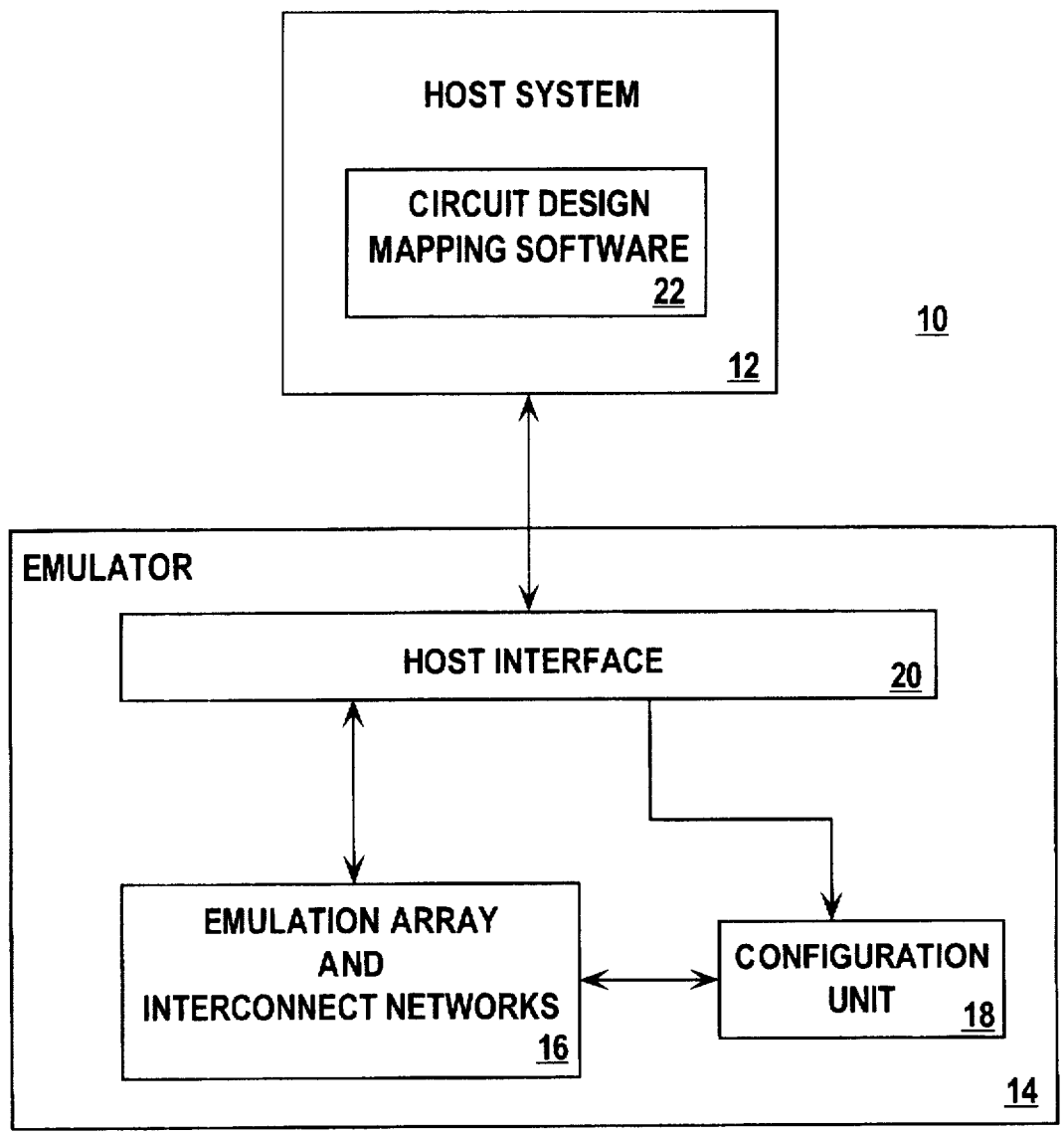
FIG. 1 shows an emulation system incorporated with the teachings of one embodiment of the present invention.

Referring now to FIG. 1, an emulation system 10 incorporated with the teachings of the present invention is shown. As illustrated, emulation system 10 includes host system 12 and emulator 14. Host system 10 includes in particular enhanced circuit design compilation/mapping software 22. Circuit design compilation/mapping software 22 are stored in suitable storage medium (not shown) of host system 10, and loaded into memory (not shown) of host system 10 for execution by one or more processors (not shown) of host system 10. Except for the enhancement provided to circuit design compilation/mapping software 22, host system 10 including circuit design compilation/mapping software 22 is intended to represent a broad category of host systems and their software found in conventional emulation systems, and thus will not be otherwise further described.

Emulator 14 includes emulation array and interconnecting networks 16, configuration unit 18 and host interface 20 coupled to each other as shown. Except for emulation array and interconnecting network 16, configuration unit 18 and host interface 20 are also intended to represent a broad category of these elements found in conventional emulators, whose functions and constitutions are also well known, and therefore will not be further described either.

Figure 2:
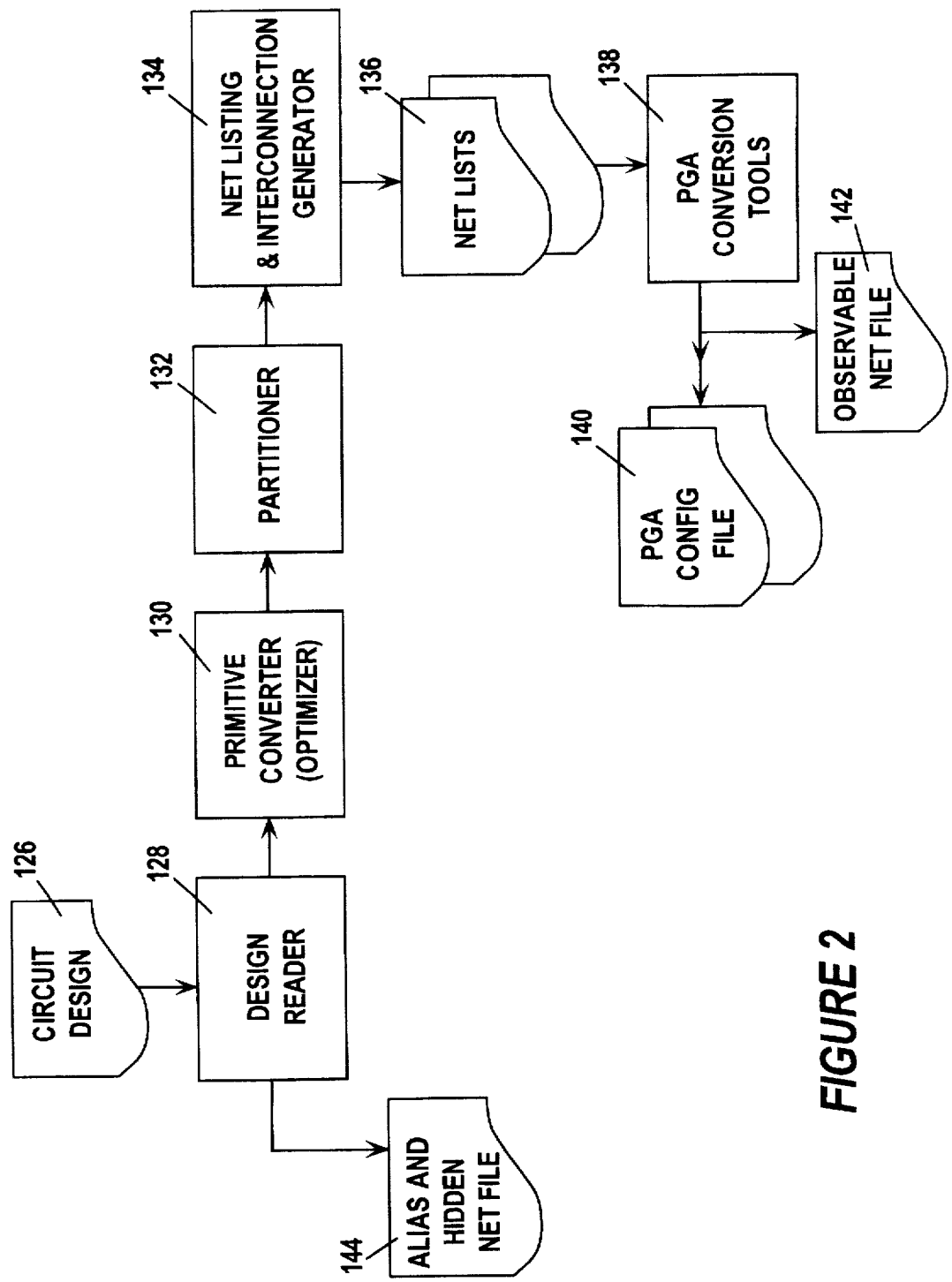
FIG. 2 illustrates one embodiment of circuit design compilation/mapping software enhanced to trace any net of a logic element.

FIG. 2 illustrates one embodiment of circuit design compilation/mapping software 22 enhanced to trace any net of an LE. As shown, circuit design compilation/mapping software 22 comprises design reader 128, primitive converter 130, partitioner 132, and net listing and interconnection generator 134 for reading, interpreting, optimizing, and partitioning circuit design 126 into net lists 136. Circuit design compilation/mapping software 22 further comprises PGA configuration tools 138 for converting net lists 136 into PGA conversion files 140, which are then used to configure emulator 14 to "realize" circuit design 126 on emulator 14. PGA conversion tools 138 also generate observable net file 142 for tracing physically observable nodes of circuit design 126. Additionally, in accordance with the present invention, design reader 128 is enhanced to generate alias and hidden net file 144 for tracing hidden nodes of circuit design 126.

Except for the generation of alias and hidden net file 144 and observable net file 142, design reader 128, primitive converter 130, etc. of circuit design compilation/mapping software 22 are intended to represent a broad category of these software tools found in conventional emulation systems, and thus will not be further described.

Nets in the present invention can be separated into two different categories: physically observable nets and hidden nets. The physically observable nets comprise the nodes in the emulation system where signals can be physically observed. These nodes include input/output signals to/from LEs and FPGAs. The hidden nets, on the other hand, comprise the nodes in the emulation system where signals cannot be physically observed. The hidden nets include combinatorial logic from the circuit design which is both mapped onto an LE and contains nodes that do not have signals output by the LE. These are considered hidden nets because the signals at the hidden nodes are not input to or output from the LE, and thus are not physically observable.

Figure 3A:
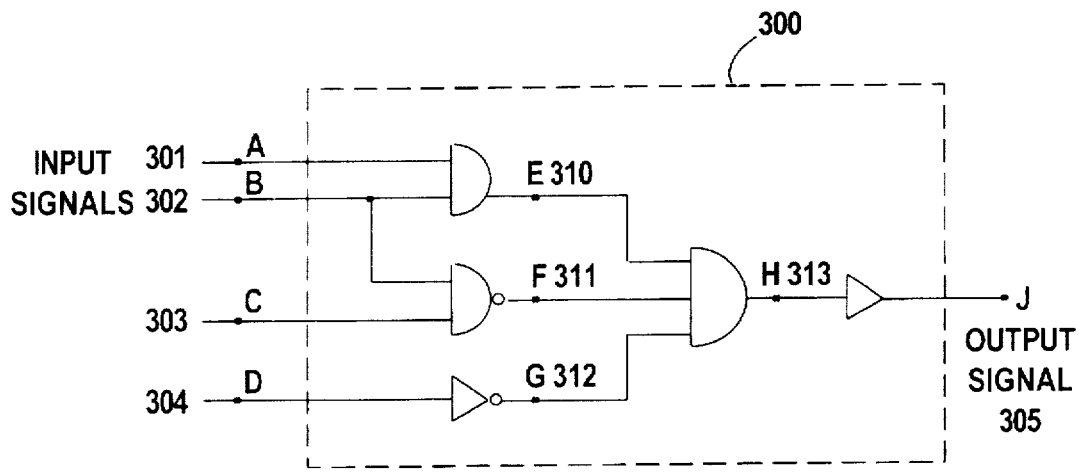
FIGS. 3a–3b illustrate examples of hidden nets.

FIG. 3a illustrates an example of a hidden net. A schematic 300 is shown which includes input signal 301 (A), input signal 302 (B), input signal 303 (C), input signal 304 (D), and output signal 305 (J). The schematic 300 comprises combinatorial logic which can be mapped onto a single LE. However, as shown in FIG. 3a, four hidden nodes are contained within schematic 300. The four nodes are node 310 (E), node 311 (F), node 312 (G), and node 313 (H). As shown in FIG. 3a, signals are not output by an LE at the four nodes 310–313.

Figure 3B:
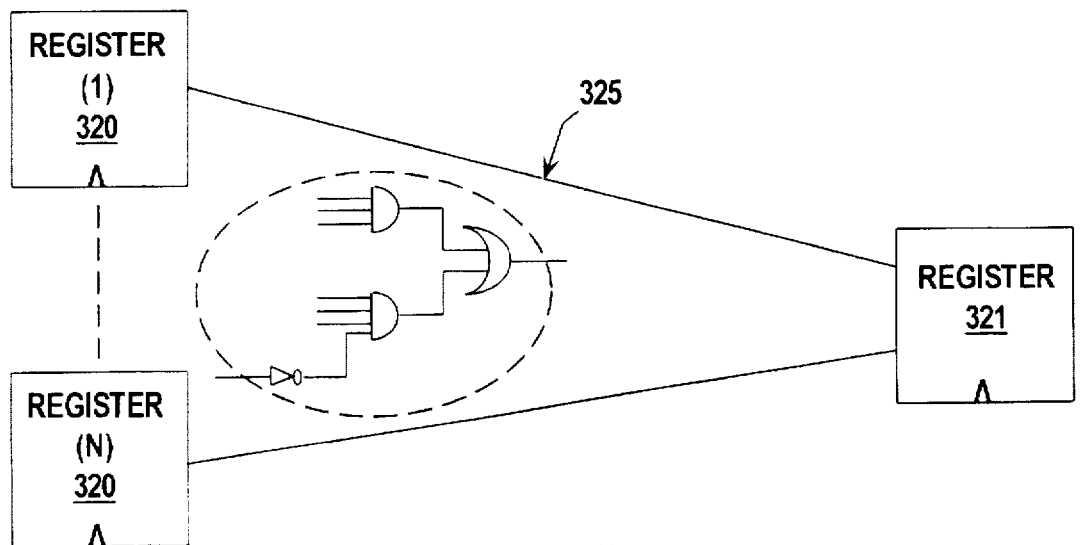

FIG. 3b illustrates another example of a hidden net. Combinatorial logic 325 between N registers 320 and register 321 can be re-synthesized to generate new combinatorial logic. This new combinatorial logic is then mapped onto one or more LEs. Accordingly, the signals at nodes within the original circuit are no longer observable.

Figure 4:
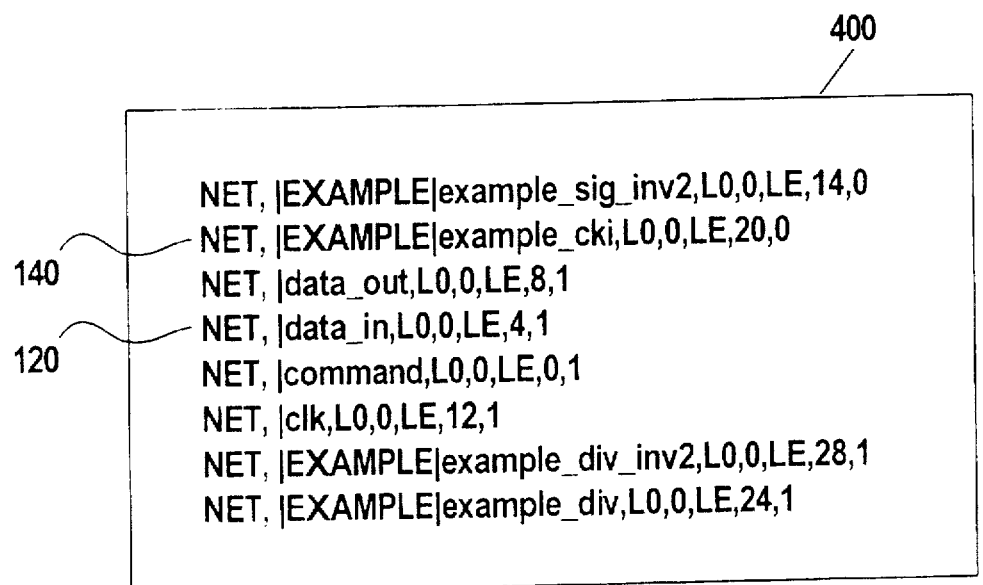
FIG. 4 illustrates an observable net file according to one embodiment of the present invention.

FIG. 4 illustrates one embodiment of observable net file 142. As shown, observable net file 142 comprises a list 400 of physically observable signals. The physically observable signals are those which are part of a physically observable net. Each line in the observable net file 142 identifies a signal, the logic element, the FPGA, and the logic board which includes the signal. In addition, each line in the observable net file 142 also indicates whether combinatorial logic or a register is mapped to the logic element. By way of example, line 410 indicates where the signal "EXAMPLE|example_cki" is located within the emulator using the notation "L0,0,LE,20,0". The "L0,0" indicates FPGA 0 of logic board 0, the "LE,20" indicates logic element 20, and the last "0" indicates combinatorial logic is mapped to the LE. By way of another example, line 420 indicates the signal "data_in" is from a register (e.g., the "1" at the end of line 420) mapped to LE 4 of FPGA 0 on logic board 0.

It is to be appreciated that the net file illustrated in FIG. 4 is an implementation-specific example of an observable net file. It is to be appreciated that observable net file 142 can be implemented in any of a wide variety of manners within the spirit and scope of the present invention.

Thus, the signals from the physically observable nodes in an emulator are indicated in observable net file 142. An emulator used in accordance with the present invention can thus trace signals at any physically identifiable node by accessing the output from the LE identified in observable net file 142 which corresponds to the requested signal.

Figure 5A:
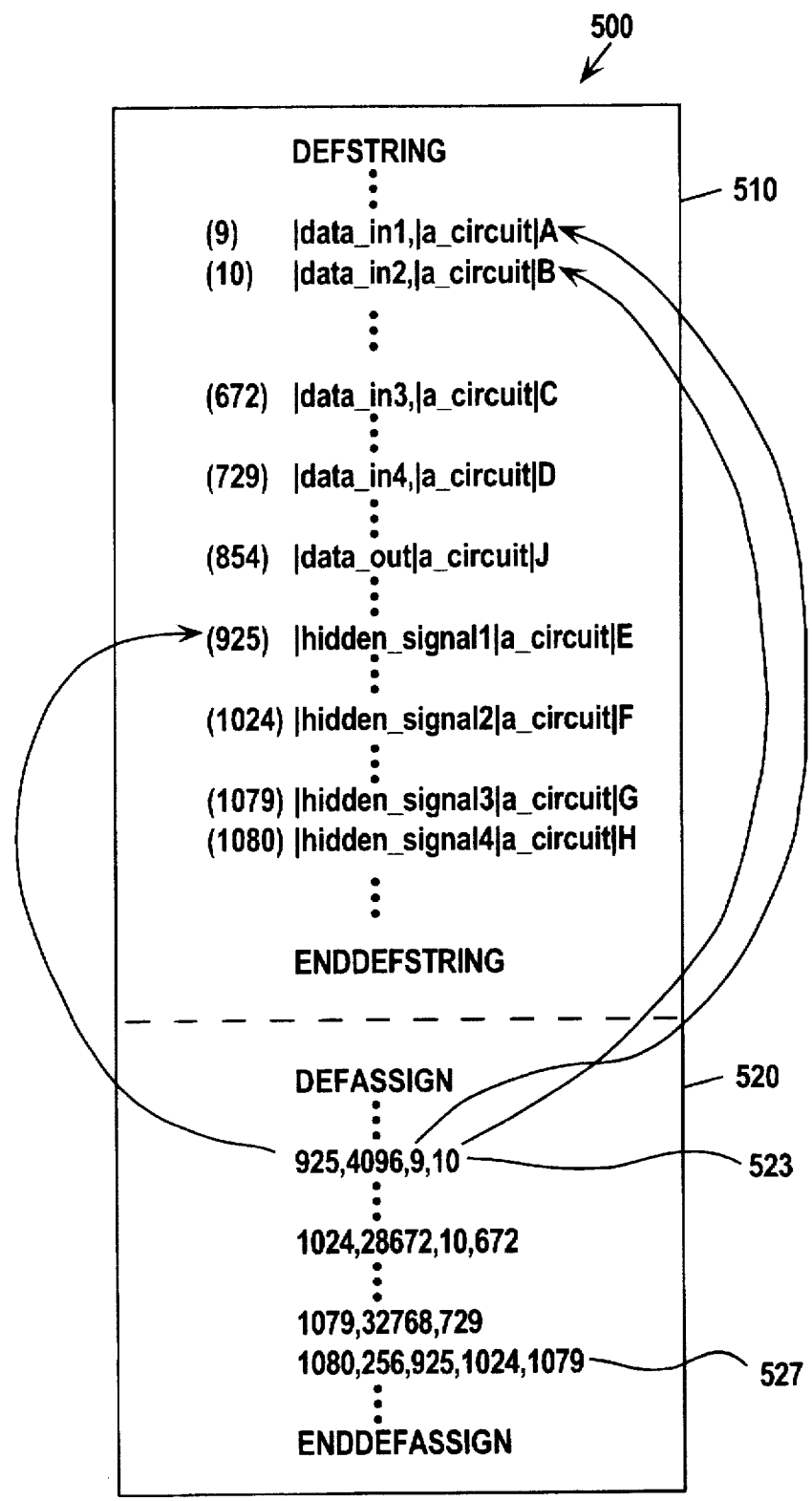
FIG. 5a illustrates an alias and hidden net file according to one embodiment of the present invention.
Figure 5B:
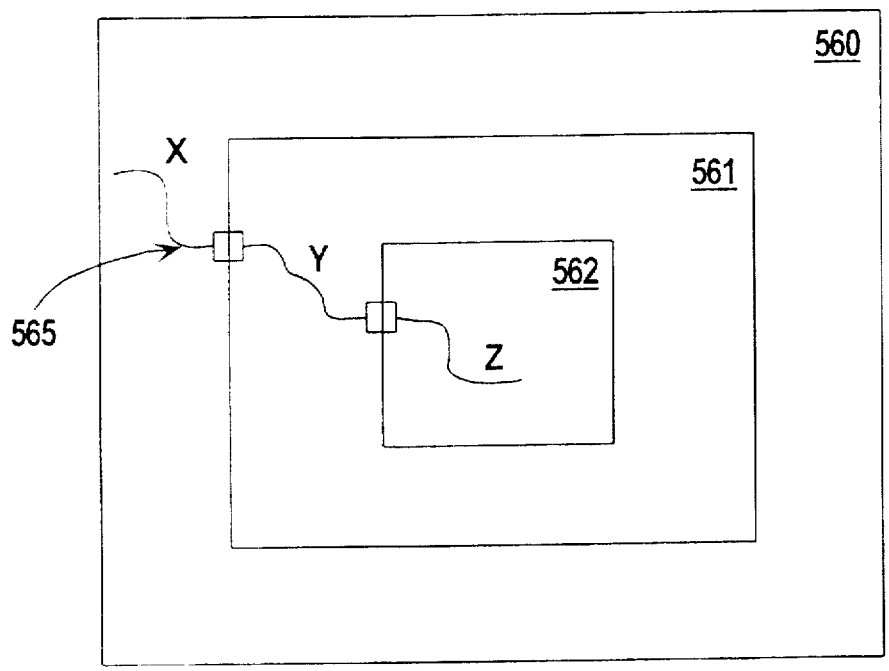
FIG. 5b illustrates multiple functional blocks organized in hierarchical levels as supported by one embodiment of the present invention.

FIG. 5a illustrates one embodiment of alias and hidden net file 144. As shown, alias and hidden net file 144 comprises a list 500 separated into two sections. The first section is an alias list 510 and the second section is a hidden node list 520. Alias list 510 provides the hierarchical aliases for signals within a net. Multiple functional blocks of a circuit design can be organized in hierarchical levels as shown in FIG. 5b. The top level block 560 can be separated into two additional sublevels, blocks 561 and 562. Signals can span multiple levels and a signal can have different names in each of the different levels. For example, the signal 565 could be named signal X in block 560, signal Y in block 561, and signal Z in block 562. Thus, signals within the same net can have different names, depending on the hierarchical level being considered. Such hierarchical levels are known to those skilled in the art, and thus will not be discussed further.

Returning to FIG. 5a, alias list 510 provides the hierarchical aliases for signals within different levels of a net. Each line of alias list 510 has a different line number, identified in parentheses to the left of the line for convenience. By way of example, line (9) of alias list 510 indicates that the signal "data_in 1" has the name A in the level "a_circuit". Signals are defined in alias list 510 for each node in the original net list (that is, in circuit design 126). Circuit design 126 provides a gate level description, so each node is identifiable by design reader 128. It should be noted that the gates may be combined later in the emulation process resulting in some of the nodes being hidden, but each of the nodes is visible at this stage of the emulation process.

The second section of list 500 is hidden node list 520. Hidden node list 520 provides a definition of each node in the original net list in terms of its input signals. This includes both nodes which will be physically observable and nodes which will be hidden. In one embodiment of the present invention, each node is defined according to the following format: signal identifier, truth table vector, input signal identifiers. In one implementation, the signal identifier and the input signal identifiers are indicated using the line numbers for the respective signals from alias list 510. By way of example, line 523 of hidden node list 520 indicates that the signal on line 925 of alias list 510 is based on the input signals from lines 9 and 10 of alias list 510.

Figure 6A:
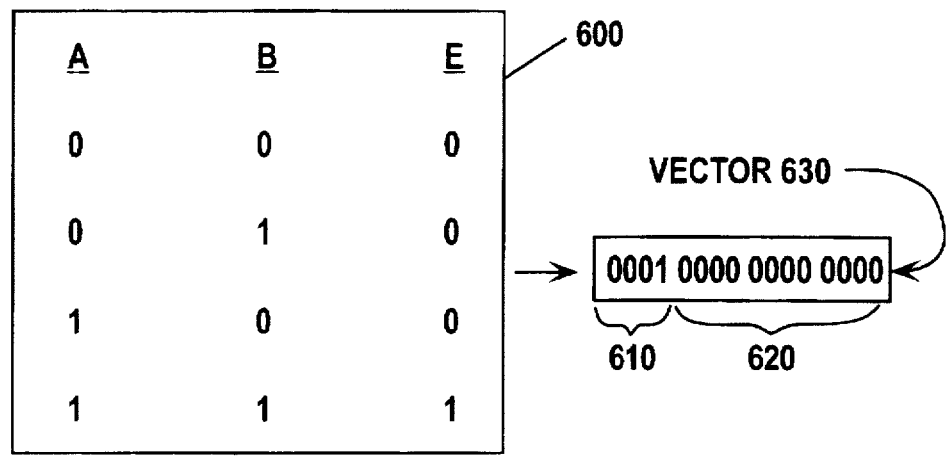
FIGS. 6a–6b show examples of generating truth table vectors according to one embodiment of the present invention.

The truth table vector is denoted using a decimal value representation whose binary equivalent corresponds to the output signal as defined by the input signal(s) using a truth table. FIG. 6a shows an example of generating a truth table vector for line 523 of hidden node list 520. Line 523 of hidden node list 520 indicates that the signal on line 523 of alias list 510 (signal E) is generated based on the input signals from lines 9 and 10 of alias list 510 (signals A and B, respectively). Further assume that signals A, B and E are coupled together in the original net list as shown in FIG. 3a. Thus, the signal E is the result of signals A and B being logically AND'd together. This is shown as truth table 600 in FIG. 6a. The values for signal E, based on the input signals A and B are then used as the first four bits of the truth table vector 630. This is shown as bits 610 of vector 630. The remaining bits 620 of truth table vector 630 are filled with zeroes as shown. Thus, truth table vector 630 provides an encoded representation of the truth table 600.

Figure 6B:
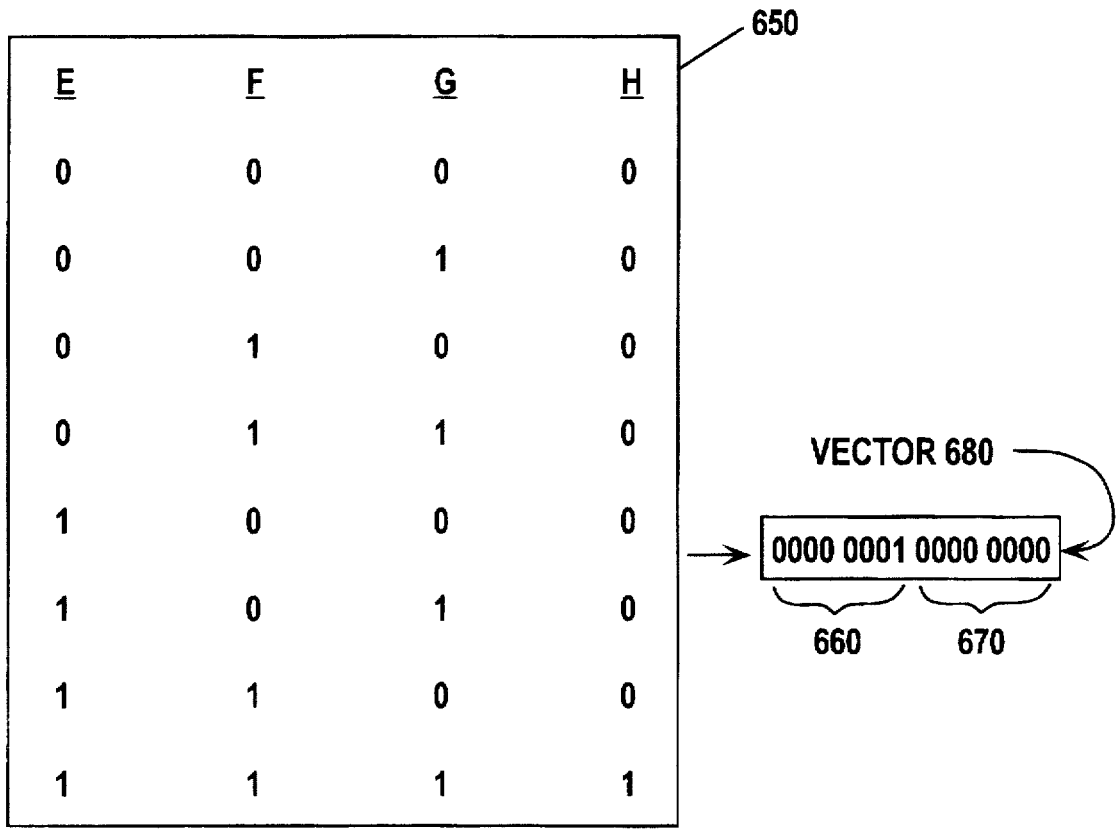

FIG. 6b shows another example of generating a truth table vector. Assume truth table 650 of FIG. 6b shows the truth table for generating signal H of FIG. 3a from signals E, F and G (as identified by line 527 of FIG. 5a). The values for signal H are used as the first eight bits of the truth table vector 680. This is shown as bits 660 of vector 680. The remaining bits 670 of vector 680 are filled with zeroes as shown.

In one embodiment of the present invention, the number of bits in truth table vector 630 is dependent on the number of input signals for the LEs of the emulation system. In one implementation, each LE has four inputs, thereby resulting in a 16 bit truth table vector. It is to be appreciated that different sized vectors could be implemented. For example, if each LE were to have five inputs, then the truth table vector would be 32 bits.

The values of the input signals identified in each line of the hidden node list 520 are used as an index into the truth table vector. The truth table vector then provides the resultant value, even though the node being accessed may actually be a hidden node. For example, assume input signals A and B have the values of one and zero, respectively. The values of one and zero indicate the third bit in the truth table vector 630. This third bit, as shown in FIG. 6, is a zero. Thus, the value of signal E is 0 given these inputs. The present invention indexes into the truth table vector in an analogous manner for signals based on one, three or four input signals.

It should be noted that some hidden nodes may be defined in terms of other hidden nodes. This situation is most likely to occur when logic is resynthesized, as discussed above with reference to FIG. 3b. However, the situation can arise in any context with hidden nodes. For example, returning to FIG. 3a, the value at node 313 (H) would be defined in hidden node list 520 of FIG. 5a in terms of the input signals at nodes 310 (E), 311 (F), and 312 (G). Each of these nodes 310–312, however, is also a hidden node. In this situation, the present invention identifies each of the input signals from hidden node list 520, and then looks up each of those input signals in hidden node list 520. The present invention continues this process until the signals are identified in terms of physically observable signals.

It is to be appreciated that the net file illustrated in FIG. 5a is an implementation-specific example of an alias and hidden net file. It is to be appreciated that alias and hidden net file 144 can be implemented in any of a wide variety of manners within the spirit and scope of the present invention.

In the discussions above, the present invention is described as determining the value of a hidden node by using the identified input signals to index into a truth table vector. However, it is to be appreciated that other techniques can also be used to determine the value of the hidden node within the spirit and scope of the present invention. For example, the values of the identified input signals may be input into a set of equations which are used to calculate the value of the hidden node.

Thus, all nodes of the circuit design being emulated are traced by the present invention. This includes both nodes which are physically observable and nodes which are hidden within an LE. In order to identify the value of a particular node at a particular time, the present invention uses the observable net file 142 and possibly the alias and hidden net file 144. If the node is physically observable, then the value of the signal at that node is readily determinable by accessing the LE identified in the observable net file 142. However, if the node is hidden, then the value of the signal at that node is determined by its physically observable input signals (as identified in the alias and hidden net file 144) by accessing the LE(s) identified in the observable net file 142 for the physically observable input signals.

Figure 7:
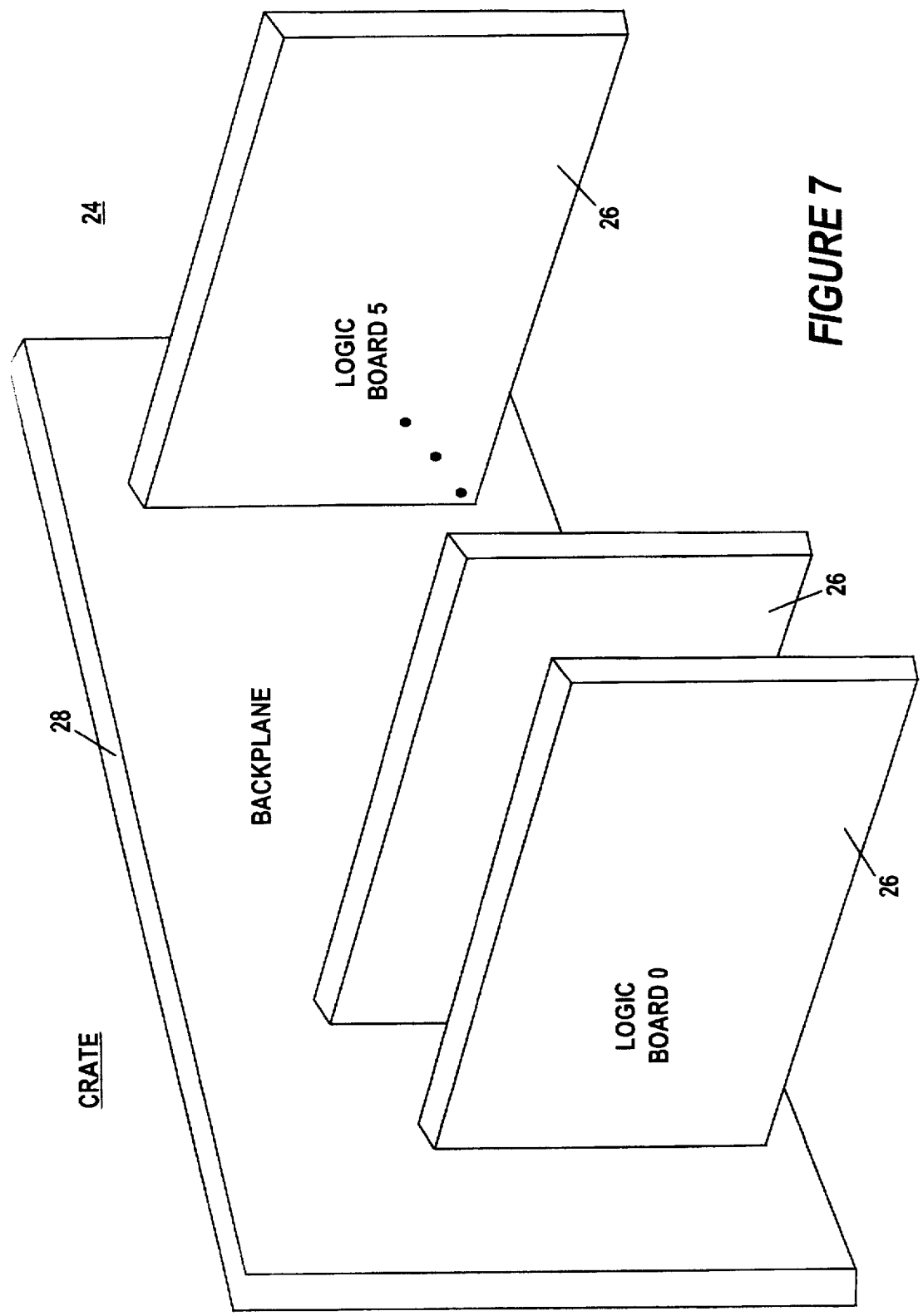
FIG. 7 is a physical view of one embodiment of the emulator of FIG. 1.

Referring now to FIG. 7, wherein a physical view of one embodiment of emulation array and interconnect networks 16 is shown. For the illustrated embodiment, emulation array and interconnect networks 16 is distributively disposed on a plurality of logic boards 26. Logic boards 26 are electrically connected to each other through backplane 28. Together, logic boards 26 and backplane 28 are packaged in crate 24. Before we proceed to describe logic boards 26 and backplane 28 in further detail, it should be noted that while for ease of explanation, the present invention is being described with a single crate embodiment, based on the description to follow, those skilled in the art will appreciate that the present invention may be practiced in any number of form factors comprising any number of "crates" with each "crate" having any number of "logic boards" directly connected to each other or indirectly connected to each other via one or more "backplanes".

Figure 8:
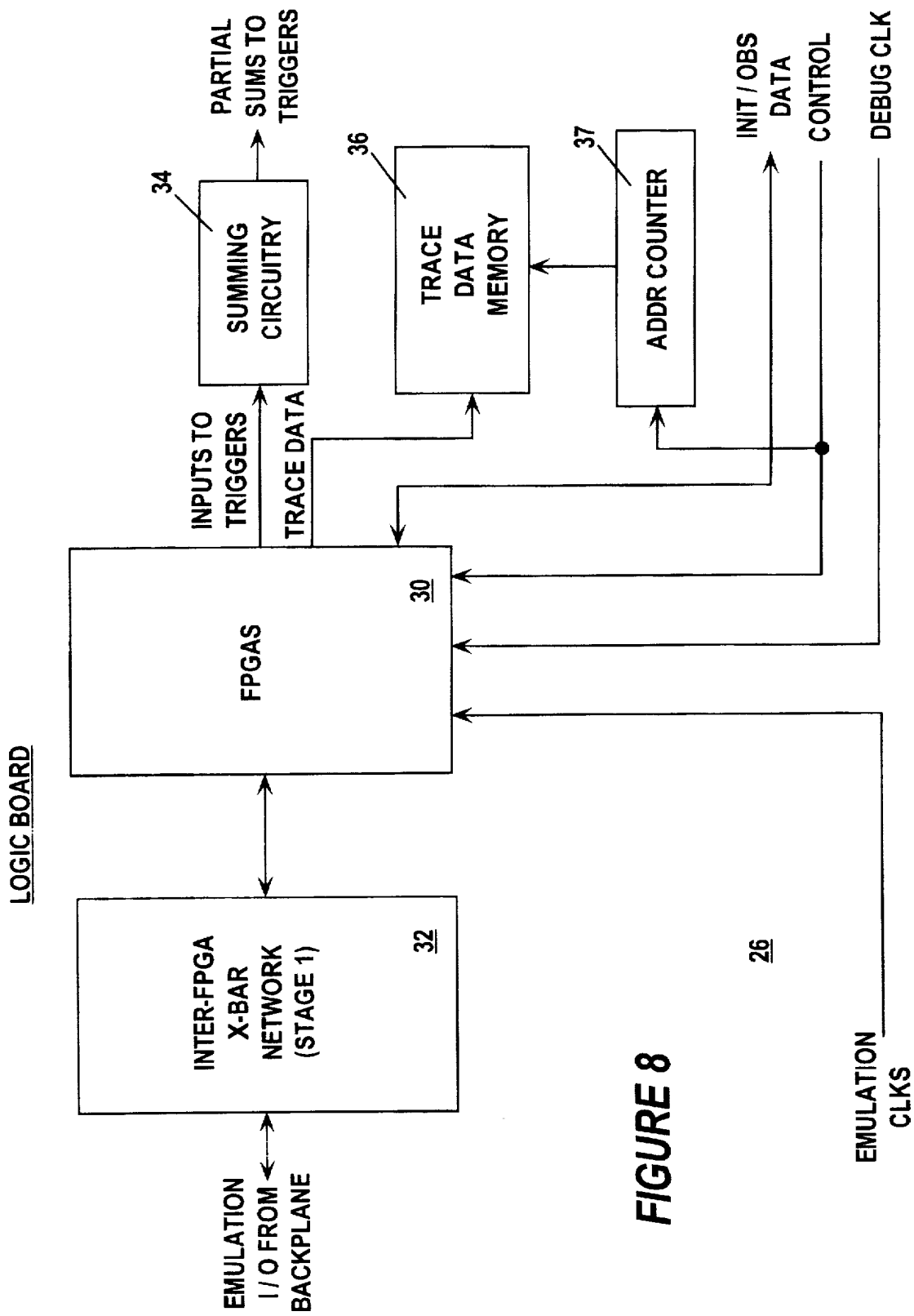
FIG. 8 illustrates one embodiment of the logic board of FIG. 7.

FIG. 8 illustrates one embodiment of logic board 26. As shown, for the illustrated embodiment, each logic board 26 comprises a plurality of FPGAs 30 for "realizing" the circuit elements of a circuit design. In other words, FPGAs 30 of emulation array 16 are distributively disposed on one or more logic boards 26. Additionally, each logic board 26 further comprises inter-FPGA crossbar (or x-bar) network (stage 1) 32 coupled to FPGAs 30 for interconnecting FPGAs 30 on the various logic boards 26 to each other and to host system 12. Furthermore, logic board 26 comprises trace data memory 36, and summing circuitry 34, both coupled to FPGAs 30, for capturing and storing LE trace data of FPGAs 30 and generating partial sums for trigger inputs output by FPGA 30. Logic boards 26 is also provided with address counter 37 for generating addresses for trace data memory 36.

In one embodiment, each FPGA of FPGAs 30 includes on-chip integrated debugging facilities. In particular, each FPGA includes a first integrated debugging facility for outputting fully visible trace data of all its LEs, on a clock cycle by clock basis, and a second integrated debugging facility for outputting inputs for a plurality of system triggers. A particular example of an FPGA having such on-chip integrated debugging facilities is disclosed in copending U.S. application Ser. No. 08/542,838, entitled "A FPGA having on-chip integrated debugging facility", having common inventorship and assignee with the present invention, and filed on Oct. 13, 1995, which is hereby fully incorporated by reference. Nevertheless, we will briefly describe the FPGA disclosed in the copending application further below.

On-board trace data memory 36 facilitates capturing and storing trace data output by FPGAs 30, i.e., signal state values of the LEs of FPGAs 30, with a deterministic locality topology. On-board address counter 37 is provided for generating addresses for on-board trace memory 36. On-board summing circuitry 34 comprises a plurality of partial sum circuits. In one embodiment, one summing circuit is provided for each system trigger, and all FPGAs 30 are coupled to each of the summing circuits 34. A particular example of trace data memory 36, address counter 37, and summing circuitry 34 is disclosed in copending U.S. application Ser. No. 08/542,946, entitled "Method and Apparatus for Performing Fully Visible Tracing of an Emulation", also having common inventorship and assignee with the present invention, and filed on October 13, 1995, which is hereby fully incorporated by reference.

Figure 9A:
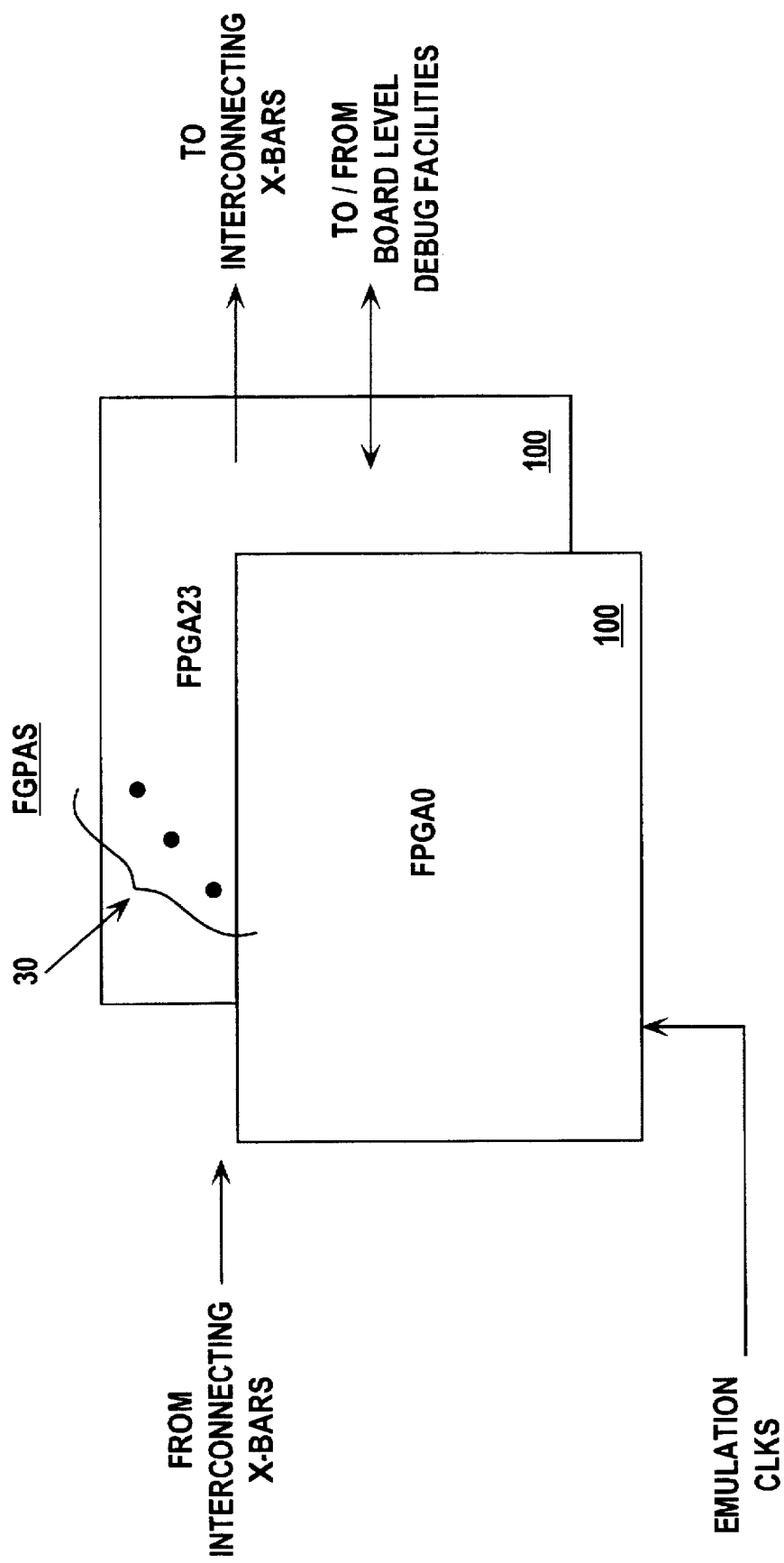
FIGS. 9a–9b illustrate one embodiment of the FPGA array of FIG. 8.
Figure 9B:
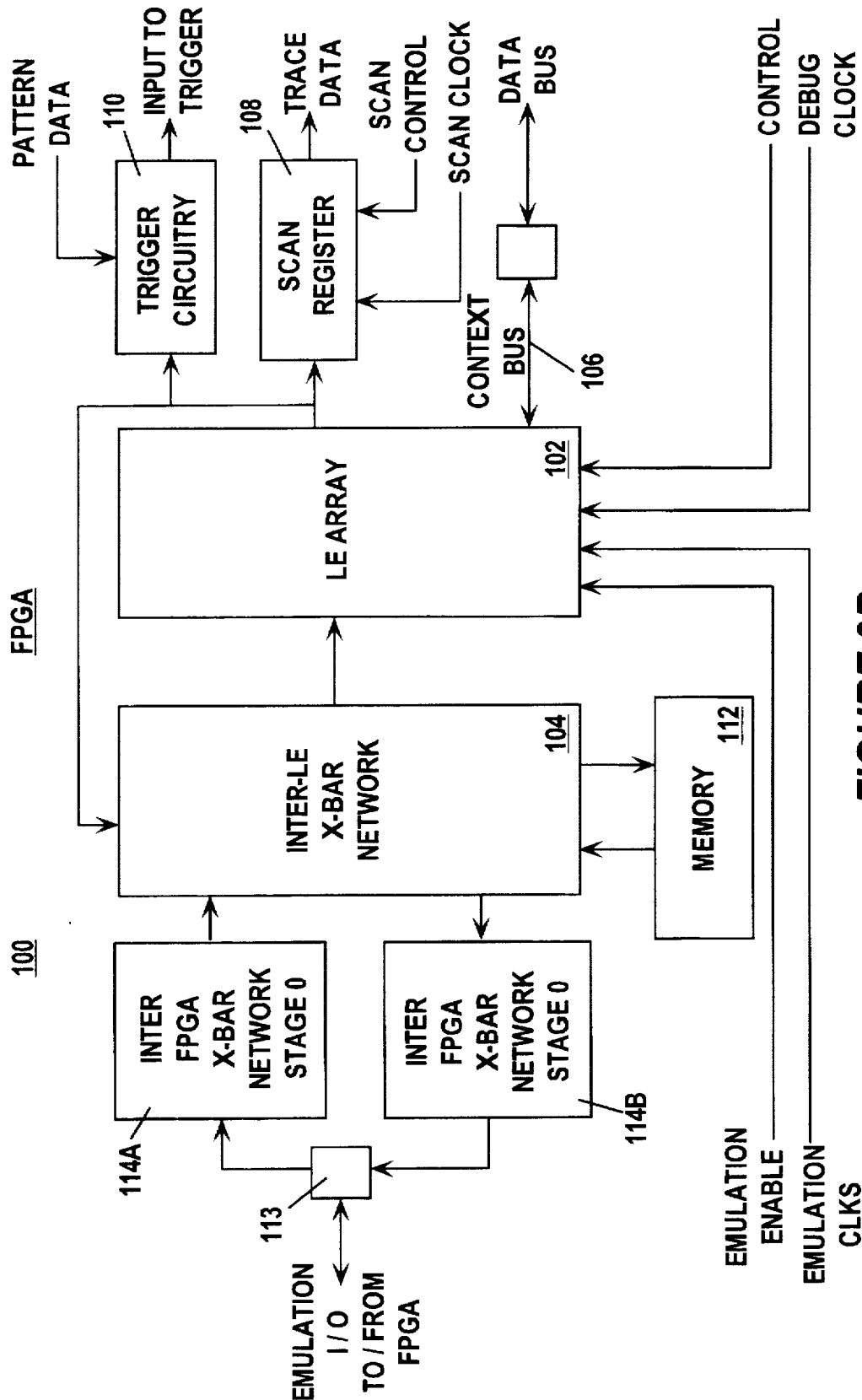

FIGS. 9a–9b illustrate one embodiment of FPGAs 30 disclosed in the copending application. As shown, for the illustrated embodiment, FPGAs 30 comprise 24 FPGAs with on-chip integrated debugging facilities 100. FPGA 100 comprises an array 102 of enhanced LEs, which are used to "realize" various elements of circuit designs. Additionally, FPGA 100 further includes context bus 106, scan register 108 and trigger circuitry 110, coupled to the LEs as shown. Context bus 106 is used for inputting and outputting values to and from the LEs. Scan register 108 is used to output trace data of all LEs of an FPGA in one clock cycle of an emulation clock, whereas trigger circuitry 110 is used to generate a number of trigger inputs in response to the detection of a number of stored data patterns.

For the illustrated embodiment, FPGA 100 further includes memory 112 to facilitate usage of FPGA 100 for emulating circuit designs with memory. Pins 113 of FPGA 100 can be preconfigured for either input or output. FPGA 100 also includes inter-LE crossbar network 104 for interconnecting the LEs 102, memory 112, and I/O pins 113, as shown. Finally, FPGA 100 also includes the inter-FPGA crossbar network (stage 0) 114 for inter-connecting FPGA 100 to other FPGAs. Inter-FPGA cross-bar network (stage 0) 114 at the chip-level "mates" with inter-FPGA cross-bar network (stage 1) 32 at the board level. For further description of FPGA 100, refer to copending U.S. application Ser. No. 08/542,838 identified above.

Thus, when an emulation system is equipped with a mechanism for generating an alias and hidden net list and an observable net list as described above, then any node within the emulation system can be traced. Therefore, a method and apparatus for tracing any node in an emulation system has been described.

While the method and apparatus of the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

What is claimed is:

1. In an emulation system, a method for tracing hidden nodes of a circuit design, the method comprising the steps of:
   (a) maintaining a correspondence between a plurality of physically observable nodes of the circuit design and the hidden nodes, including how values of the hidden nodes are to be determined based on the plurality of physically observable nodes;
   (b) accessing values of the plurality of physically observable nodes; and
   (c) determining the values of the hidden nodes based at least in part on both the values of one or more of the plurality of physically observable nodes and the correspondence between the plurality of physically observable nodes and the hidden nodes.

2. The method of claim 1, wherein the maintaining step (a) comprises the steps of:
   generating a first list listing the physically observable nodes; and
   generating a second list listing the hidden nodes, wherein each node of the second list is defined in terms of selected ones of the physically observable nodes.

3. The method of claim 2, wherein the maintaining step (a) further comprises the steps of:
   generating a truth table vector for each node of the second list; and
   storing the truth table vectors with the second list, wherein each truth table vector identifies the values of the corresponding hidden node as a function of the values of the physically observable nodes.

4. The method of claim 1, further comprising the step of:
   outputting the values of the hidden nodes to a user.

5. A method for tracing any node of a circuit design in an emulator, the method comprising the steps of:
   (a) generating a physically observable net list identifying a first plurality of nodes of the circuit design which can be physically observed in the emulator;
   (b) creating a hidden net list identifying a second plurality of nodes of the circuit design, wherein each node of the second plurality of nodes is hidden in a logic element of the emulator;
   (c) determining a first set of input nodes from the first plurality of nodes; and
   (d) using the first set of input nodes to identify a value of a signal at a first hidden node, wherein the first hidden node is one of the second plurality of nodes.

6. The method of claim 5, further comprising the step of generating a first truth table vector which encodes a set of possible values for the first hidden node based on different values of the first set of input nodes.

7. The method of claim 6, further comprising the step of using the values of the first set of input nodes as an index into the truth table vector.

8. The method of claim 5, wherein the using step (d) comprises the steps of:
   accessing the set of input nodes to identify a value of a signal at a second hidden node, wherein the second hidden node is one of the second plurality of nodes; and
   using the value of the signal at the second hidden node to determine the value of the signal at the first hidden node.

9. A program storage device readable by an emulation system, the device embodying a program of instructions executable by the emulation system to perform method steps for tracing a node of a circuit design, wherein the node is hidden in a logic element of the emulation system, said method steps comprising:
   (a) identifying a set of physically observable input signals corresponding to the node;
   (b) indexing into a truth table vector using values of the set of physically observable input signals; and
   (c) determining the value of the hidden node by accessing the value of the truth table vector indicated by the indexing.

10. The program storage device of claim 9, further comprising the step of storing a set of node identifications corresponding to the set of physically observable input signals in an observable net file.

11. The program storage device of claim 9, further comprising the step of generating a hidden net list which stores the truth table vector.

12. The program storage device of claim 11, wherein the hidden net list also stores the node and a set identifier of the set of physically observable input signals.

13. A program storage device readable by a computer system, the device embodying a program of instructions executable by the computer system to perform method steps for tracing hidden nodes of a circuit design, said method steps comprising:
- (a) maintaining a correspondence between a plurality of physically observable nodes of the circuit design and the hidden nodes, including how values of the hidden nodes are to be determined based on the plurality of physically observable nodes;
- (b) accessing values of the plurality of physically observable nodes from an emulator coupled to the computer system upon receiving a request for the value of a first hidden node; and
- (c) determining the value of the first hidden node based at least in part on both the values of one or more of the plurality of physically observable nodes and the correspondence between the plurality of physically observable nodes and the first hidden node.

14. The program storage device of claim 13, wherein the maintaining step (a) comprises the steps of:

generating a first list listing the physically observable nodes; and generating a second list listing the hidden nodes, wherein each node of the second list is defined in terms of selected ones of the physically observable nodes.

15. The program storage device of claim 13, wherein the determining step (c) comprises the steps of:

accessing values of the plurality of physically observable nodes to identify a value of a second hidden node; and using the value of the second hidden node to determine the value of the first hidden node.

16. The program storage device of claim 13, wherein the program of instructions are further to perform the method step of:

outputting the values of the hidden nodes to a user.

17. An emulation system which traces a node of a circuit design, the emulation system comprising:

a logic element in which the node is hidden;

means for identifying a set of physically observable input signals corresponding to the node;

means for indexing into a truth table vector using values of the set of physically observable input signals; and means for determining the value of the hidden node by accessing the value of the truth table vector indicated by the indexing.

18. The emulation system of claim 17, further comprising the means for storing a set of node identifications corresponding to the set of physically observable input signals.

19. The emulation system of claim 17, further comprising means for generating a hidden net list which stores the truth table vector.

20. The emulation system of claim 19, wherein the hidden net list also stores the node and a set identifier of the set of physically observable input signals.

* * * * *